United States Patent
Morgana et al.

(10) Patent No.: US 8,583,391 B2
(45) Date of Patent: Nov. 12, 2013

(54) MONITORING THE LOW CYCLE FATIGUE OF RUGGEDIZED AVIONICS ELECTRONICS

(75) Inventors: Edward R. Morgana, Bristol, CT (US); Kevin P. Roy, West Springfield, MA (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 217 days.

(21) Appl. No.: 13/087,682

(22) Filed: Apr. 15, 2011

(65) Prior Publication Data
US 2012/0265466 A1    Oct. 18, 2012

(51) Int. Cl.
*G06F 19/00*    (2011.01)
(52) U.S. Cl.
USPC ............. 702/81; 702/183; 702/188; 73/161
(58) Field of Classification Search
USPC .................. 702/81, 183, 188; 73/161
See application file for complete search history.

(56) References Cited

U.S. PATENT DOCUMENTS

| | | |
|---|---|---|
| 7,538,684 B2 | 5/2009 | Schnetker |
| 2010/0131240 A1* | 5/2010 | Holland ................. 702/183 |
| 2012/0049697 A1* | 3/2012 | Andarawis et al. ......... 310/68 B |

\* cited by examiner

*Primary Examiner* — Jonathan C Teixeira Moffat
*Assistant Examiner* — Hien Vo
(74) *Attorney, Agent, or Firm* — Kinney & Lange, P.A.

(57) ABSTRACT

A health monitoring system for monitoring the health of an electronic system. The health monitoring system includes an analog-to-digital converter, and a monitoring circuit within the electronic system. The monitoring circuit includes fatigue life characterized electrical components representative of electrical components comprising the balance of the electronic system. The fatigue life characterized electrical components are employed solely to monitor the health of the electronic system. The monitoring circuit output is electrically connected to the analog-to-digital converter.

20 Claims, 1 Drawing Sheet

MONITORING THE LOW CYCLE FATIGUE OF RUGGEDIZED AVIONICS ELECTRONICS

BACKGROUND

The present invention relates to electronic systems aboard aircraft. In particular, the invention relates to health monitoring of electronic systems aboard aircraft.

Aircraft require highly reliable electronic systems to ensure safe and efficient operation. Malfunctions in critical electronic systems, such as an Electronic Engine Controller (EEC) or a Full Authority Digital Engine Controller (FADEC) can result in a loss of engine performance, including an in-flight shut down of an aircraft engine. Malfunctions in other critical electronic systems, such as flight control systems or a general avionics unit, can result in difficulty controlling or navigating the aircraft.

Aircraft with short flight times, such as small commercial aircraft, accumulate high numbers of thermal cycles per flight hour as they move between generally warmer ambient temperatures near the ground and generally colder ambient temperatures at flight altitude. Such thermal cycling degrades electronic systems, especially on-engine EECs and FADECs, and non-avionics bay electronics, due to failures of solder joints and electronic component attachment leads from Low Cycle Fatigue (LCF) damage. In addition, powering up and powering down electronic systems contributes to the thermal stresses experienced by the electronic components. Vibration effects also contribute to failures of solder joints and attachment leads. Electronic system designs, particularly for commercial engine controls, are demanding ever-increasing service life requirements. Service life requirements as high as 100,000 flight hours are not uncommon. The service life requirements can limit the selection of components available to perform the necessary control functions, which leads to larger, heavier, and more expensive designs than what could be achieved with current state of the art packages. This is especially true when a specified environment for the service life requirement represents a worst-case environment that is beyond the conditions experienced by the majority of the engine controls.

Health monitoring systems have been described that permit the use of Commercial Off The Shelf (COTS) electrical components. A health monitoring system indicates when a monitored electronic system has experienced enough degradation that it should be serviced or replaced. The ability to reliably identify failing electronic systems well ahead of the point of failure permits the use of COTS electrical components. Some of the health monitoring systems known in the art sense and record the conditions experienced by the electronics systems, e.g. vibration, temperature cycles, etc., and employ algorithms to indicate when the useful life of the electronics is near. Such systems rely on the ability of the sensed conditions to represent all or most of the environmental stresses experienced by the electronic systems. Other health monitoring systems measure portions of a circuit performing a desired system function, where the circuit can still perform its function after some measurable degradation of the circuit. Such systems are limited to designs where the circuit has a built-in reserve capacity to perform its function. In addition, the warning lead time is limited because of the use of identical components in the circuit. Once one component fails, the identical remaining components, essential for the circuit to function, are likely to fail soon after.

SUMMARY

One embodiment of the present invention is a health monitoring system for monitoring the health of an electronic system. The health monitoring system includes an analog-to-digital converter, and a monitoring circuit within the electronic system. The monitoring circuit includes fatigue life characterized electrical components representative of electrical components in at least a portion of the balance of the electronic system. The fatigue life characterized electrical components are employed solely to monitor the health of the electronic system. The monitoring circuit output is electrically connected to the analog-to-digital converter.

DETAILED DESCRIPTION

The present invention is a health monitoring system for monitoring the health of an electronic system by employing within the electronic system a monitoring circuit including fatigue life characterized electrical components. The fatigue life characterized electrical components are representative of other electrical components employed within at least a portion of the balance of the electronic system. The fatigue life characterized electrical components are employed solely to monitor the health of the electronic system and play no role in any function of the electronic system, beyond monitoring the health of the electrical components they represent. The fatigue life characterized electrical components have well known and well documented statistical lifetimes in response to environmental stresses leading to failures of solder joints and electronic component attachment leads from Low Cycle Fatigue (LCF) damage. In addition, the fatigue life characterized electrical components selected, although representative of the other electrical components, have statistically significant shorter life expectancies under such environmental stresses than the other electrical components. Thus, the health monitoring system detects LCF failures within the monitoring circuit well ahead of the appearance of such failures among the electrical components employed in at least a portion of the balance of the electronic system. This early, accurate warning permits efficient maintenance scheduling for repair or replacement of the electronic system. In addition, the ability to accurately monitor and flag the electronic systems well ahead of its point of failure enables the use of smaller, lighter and less expensive Commercial Off The Shelf (COTS) electrical components within the electronic system. Because the fatigue life characterized electrical components have no role in the function of the electronic system, beyond monitoring the health of the electronic system, they can be selected based solely on their known life expectancies. Thus, the health monitoring system of the present invention can provide a desired warning lead time for service or replacement of the electronic system through the selection of suitable fatigue life characterized electrical components.

Figure 1:
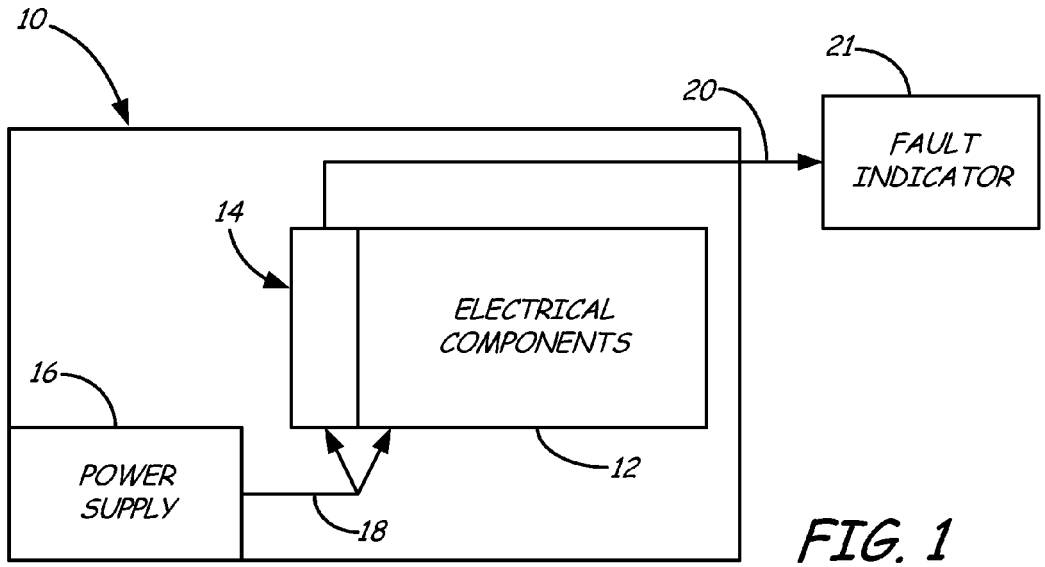
FIG. 1 is a representative diagram of an electronic system comprising an embodiment of a health monitoring system of the present invention.

FIG. 1 is a block diagram of an electronic system comprising an embodiment of a health monitoring system of the present invention. As shown in FIG. 1, electronic system 10 includes electrical components 12, health monitoring system 14, power supply 16, power supply connection 18, health monitoring system output connection 20, and fault indicator 21. Electronic system 10 is, for example, an Electronic Engine Controller (EEC), a Full Authority Digital Engine Controller (FADEC), a flight control system, or a general avionics unit. Electrical components 12 are electrical components that perform all functions of electronic system 10 other than the health monitoring function performed by health monitoring system 14. Electrical components 12 are any electronic components known in the art for use in modern electronic systems, for example, microprocessors, oscillators, resistors, capacitors, diodes, etc. Power supply 16 is any power supply known in the art for use in modern electronic systems. Power supply connection 18 is any type of conductive element for transmitting power from a power supply to electrical components requiring power. Health monitoring system output connection 20 is any type of electrical connection for conducting a digital signal, for example, a digital bus. Fault indicator 21 is any sort of electrical device for monitoring a digital signal output and indicating a fault if the monitored digital signal output deviates from an expected value, for example, a monitor, a display, an alarm, a data logger, or a computer.

As shown in FIG. 1, health monitoring system 14 is physically attached to electrical components 12 within electronic system 10 to ensure that health monitoring system 14 experiences substantially the same ambient temperature and vibration as electrical components 12. Power supply 16 is electrically connected to both electrical components 12 and health monitoring system 14 by power supply connection 18. Health monitoring system connection 20 electrically connects health monitoring system 14 to fault indicator 21.

In operation, power supply 16 supplies power to both electrical components 12 and health monitoring system 14 over power supply connection 18. This ensures that thermal effects associated with powering up and powering down electrical components experienced by electrical components 12 are also experienced by health monitoring system 14. Once powered up, electrical components 12 perform the functions required of electronic system 10, other than the health monitoring function performed by health monitoring system 14. Meanwhile, health monitoring system 14 monitors the health of electronic system 10 as described below in reference to FIG. 2. The output of health monitoring system 14 is communicated by health monitoring system connection 20 to fault indicator 21.

The embodiment of FIG. 1 shows power supply 18 contained within electronic system 10. It is understood power may be supplied other than from a power supply within electronic system 10, so long as power is supplied to both health monitoring system 14 and electrical components 12 at substantially the same time and for substantially the same time period.

The embodiment shown in FIG. 1 ensures that health monitoring system 14 experiences substantially the same environmental stresses as electrical components 12 of electronics system 10. The effects of power up and power down, as well as ambient temperature cycles and vibration that degrade electrical components 12 also impact health monitoring system 14.

Figure 2:
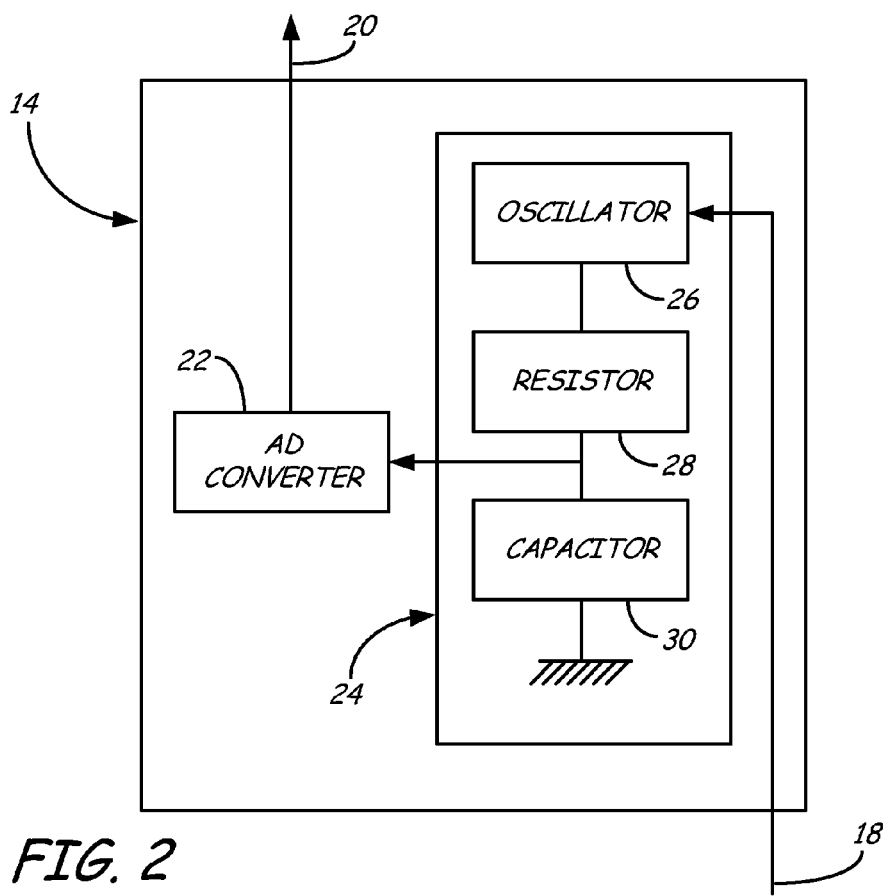
FIG. 2 is a representative diagram of an embodiment of a health monitoring system according to the present invention.

FIG. 2 is a representative diagram of an embodiment of a health monitoring system employing fatigue life characterized electrical components according to the present invention. Each fatigue life characterized electrical component is of a specific type of electrical component, for example, an oscillator, resistor or capacitor, that has been extensively tested, in statistically significant numbers, such that the number of thermal cycles required to cause a LCF failure (LCF failure point) in any one of the specific type of fatigue life characterized electrical components is known within certain statistical limits. The fatigue life testing necessary to obtain this type of characterization information includes analyzing thermal cycle test failures to determine which electrical components have failed due to LCF damage to solder joints and calculating an average and a statistical distribution of the LCF failure point for the fatigue life characterized electrical component. FIG. 2 illustrates details of health monitoring system 14 referred to above in reference to FIG. 1. As shown in FIG. 2, health monitoring system 14 includes analog to digital converter (A/D) 22, and monitoring circuit 24. Monitoring circuit 24 comprises oscillator 26, resistor 28, and capacitor 30. Oscillator 26, resistor 28, and capacitor 30 are fatigue life characterized electrical components. Oscillator 26 is, for example, an oscillator in a 4-pin leadless ceramic package. Resistor 28 is, for example, a resistor in a RM 2512 ceramic package. Capacitor 30 is, for example, a capacitor in a CDR32 ceramic package. Electrical components in ceramic packages are known to be among the most sensitive to degradation of solder joints due to thermal cycling, resulting in LCF failures, because of the generally large difference in thermal expansion coefficients between the ceramics employed in the ceramic packages and a printed wiring board (PWB) or printed circuit board (PCB) to which the electrical components are attached. Monitoring circuit 24 may be attached to a PWB or PCB in common with at least a portion of electrical components 12. As shown in FIG. 2, oscillator 26 is powered by power supply connection 18 and is electrically connected to resistor 28. Resistor 28 is electrically connected to capacitor 30, which is, in turn connected to ground. A/D 22 connects to monitoring circuit 24 at the electrical connection between resistor 28 and capacitor 30. Health monitoring system connection 20 connects to health monitoring system 14 at A/D 22.

In response to power from power supply connection 18, the fatigue life characterized components, oscillator 26, resistor 28, and capacitor 30, produce a direct current (DC) voltage signal with very little ripple at the point where A/D 22 connects to monitoring circuit 24. The DC voltage is read by A/D 22, converted to a digital voltage signal, and sent to fault indicator 21 over health monitoring system connection 20. Fault indicator 21 compares the digital voltage signal from A/D 22 with an expected digital voltage signal. Any substantial change in the digital voltage signal from the expected digital voltage signal, for example, a failure of capacitor 30 resulting in wide variations of the digital voltage signal, causes fault indicator 21 to indicate a fault from health monitoring system 14. The indicated fault is caused by the failure of a solder joint or an electrical component attachment lead due to damage from LCF. Because the fatigue life characterized components, oscillator 26, resistor 28, and capacitor 30, are selected for their statistically predictable LCF failure point, a point known to be statistically earlier than for electrical components 12, the fault indication acts as an early warning that electronic system 10 is due to be taken out of service for routine maintenance or replacement. Thus, the health monitoring system of the present invention can provide a desired warning lead time for service or replacement of an electronic system through the selection of suitable fatigue life characterized electrical components.

The embodiment described in reference to FIG. 2 illustrates one circuit configuration suitable for a health monitoring system of the present invention. However, it is understood that the circuit of FIG. 2 is exemplary and that other circuits comprising fatigue life characterized electrical components different than those described may work as well.

Finally, although the invention has been described for electronic systems aboard aircraft, it is understood that the invention applies to non-aircraft systems requiring highly reliable electronic systems operating in an environment of significant temperature cycling and vibration.

The health monitoring system of the present invention provides several advantages. The invention monitors the health of an electronic system by employing within the electronic system a monitoring circuit comprising fatigue life characterized electrical components representative of electrical components within the balance of the electronic system. Because the fatigue life characterized electrical components have no role in the function of the electronic system, beyond monitoring the health of the electronic system, they can be selected based solely on their known life expectancies to provide a desired level of warning lead time. This early, accurate warning permits efficient maintenance scheduling for repair or replacement of the electronic system. In addition, the ability to accurately monitor and flag electronic systems well ahead of their point of failure enables the use of use of smaller, lighter and less expensive COTS electrical components. Because of more accurate health monitoring, the electronic systems need not be over-designed to provide an extra margin to compensate for conservative environmental estimates, less accurate health monitoring, or a complete lack of health monitoring, thus saving further cost and weight. The present invention also ensures that the health monitoring system experiences substantially the same environmental stresses as the electrical components instead of relying on indirect sensor measurements which do not adequately take into account compounding effects of power up/power down and vibration.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A health monitoring system for monitoring the health of an electronic system, the health monitoring system comprising:
    a monitoring circuit within the electronic system, the monitoring circuit including fatigue life characterized electrical components representative of electrical components in at least a portion of the balance of the electronic system, wherein the fatigue life characterized electrical components have a statistically significantly shorter life expectancy than the electrical components in at least a portion of the balance of the electronic system, and are employed solely to monitor the health of the electronic system; and
    an analog-to-digital converter;
    wherein an output of the monitoring circuit is electrically connected to the analog-to-digital converter; and the health monitoring system detects failures within the monitoring circuit before the appearance of such failures among the electronic components employed in at least a portion of the balance of the electronic system.

2. The health monitoring system of claim 1, wherein the fatigue life characterized electrical components include at least one electrical component in a ceramic package.

3. The health monitoring system of claim 1, wherein the fatigue life characterized electrical components are characterized by life temperature cycling a statistically significant quantity of substantially identical electrical components.

4. The health monitoring system of claim 1, wherein the fatigue life characterized electrical components comprise:
    an oscillator;
    a capacitor with a first side and a second side, wherein the first side is electrically connected to ground; and
    a resistor with a first connection and a second connection opposite the first connection, wherein the first connection is electrically connected to the oscillator and the second connection is electrically connected to the second side of the capacitor.

5. The health monitoring system of claim 4, wherein the output of the monitoring circuit is between the second connection of the resistor and the second side of the capacitor.

6. An electronic system comprising:
    electrical components;
    a health monitoring system for monitoring the health of the electronic system, the health monitoring system comprising:
        a monitoring circuit including fatigue life characterized electrical components representative of at least a portion of the electrical components, wherein the fatigue life characterized electrical components have a statistically significantly shorter life expectancy than the electrical components in at least a portion of the balance of the electronic system, and are employed solely to monitor the health of the electronic system; and
        an analog-to-digital converter;
        wherein an output of the monitoring circuit is electrically connected to the analog-to-digital converter; and
    a power supply connection supplying power to the electrical components and to the health monitoring system;
    wherein the health monitoring system detects failures within the monitoring circuit before the appearance of such failures among the electronic components employed in at least a portion of the balance of the electronic system.

7. The electronic system of claim 6, wherein the electronic system is at least one of an electronic engine controller, a full authority digital engine controller, a flight control system, and a general avionics unit.

8. The electronic system of claim 6, wherein the fatigue life characterized electrical components and the electrical components are powered by the power supply connection at substantially the same time.

9. The electronic system of claim 6, wherein the electrical components and the monitoring circuit are physically contained within a single enclosure, such that the electrical components and the monitoring circuit experience substantially the same ambient temperature and vibration.

10. The electronic system of claim 6, wherein the fatigue life characterized electrical components comprise at least one fatigue life characterize electrical component in a ceramic package.

11. The electronic system of claim 6, wherein the fatigue life characterized electrical components are characterized by life temperature cycling a statistically significant quantity of substantially identical electrical components.

12. The electronic system of claim 6, wherein fatigue life characterized electrical components comprise:
    an oscillator;
    a capacitor with a first side and a second side, wherein the first side is electrically connected to ground; and a resistor with a first connection and a second connection opposite the first connection, wherein the first connection is electrically connected to the oscillator and the second connection is electrically connected to the second side of the capacitor.

13. The electronic system of claim 12, wherein the output of the monitoring circuit is between the second connection of the resistor and the second side of the capacitor.

14. A method for monitoring the health of an electronic system to indicate the electronic system is in a condition for service or replacement due to low cycle fatigue, the method comprising:
obtaining fatigue life characterized electrical components representative of electrical components of the electronic system, the fatigue life characterized electrical components having a statistically significantly shorter life expectancy than the electrical components of the electronic system;
assembling the fatigue life characterized electrical components to form a monitoring circuit, the monitoring circuit having a known expected output;
installing the monitoring circuit within the electronic system such that the monitoring circuit experiences ambient temperature effects and vibration effects substantially similar to those experienced by the electrical components of the electronic system, wherein the monitoring circuit does not support a function or set of functions of the electronic system other than health monitoring of the electronic system;
applying power to the monitoring circuit and the electrical components of the electronic system;
monitoring an output of the monitoring circuit; and
indicating that the electronic system is in a condition for service or replacement due to low cycle fatigue when the monitored output of the monitoring circuit deviates significantly from the known expected output by indicating low cycle fatigue failures within the monitoring circuit before the appearance of such failures among the electronic components employed in at least a portion of the balance of the electronic system.

15. The method of claim 14, wherein the electronic system is at least one of an electronic engine controller, a full authority digital engine controller, a flight control system, and a general avionics unit.

16. The method of claim 14, wherein obtaining fatigue life characterized electrical components comprises:
temperature cycling a statistically significant quantity of electrical components substantially identical to the fatigue life characterized electrical components desired;
analyzing the electrical components that failed during temperature cycling;
determining which of the failed electrical components failed due to low cycle fatigue damage to solder joints; and
calculating an average and a statistical distribution of the number of temperature cycles required to cause electrical component failure from low cycle fatigue from the electrical components determined to have failed due to low cycle fatigue damage.

17. A health monitoring system for monitoring the health of an electronic system, the health monitoring system comprising:
a monitoring circuit within the electronic system, the monitoring circuit including fatigue life characterized electrical components representative of electrical components in at least a portion of the balance of the electronic system, wherein the fatigue life characterized electrical are employed solely to monitor the health of the electronic system, the fatigue life characterized components including:
an oscillator;
a capacitor with a first side and a second side, wherein the first side is electrically connected to ground; and
a resistor with a first connection and a second connection opposite the first connection, wherein the first connection is electrically connected to the oscillator and the second connection is electrically connected to the second side of the capacitor; and
an analog-to-digital converter;
wherein an output of the monitoring circuit is electrically connected to the analog-to-digital converter.

18. The health monitoring system of claim 17, wherein the output of the monitoring circuit is between the second connection of the resistor and the second side of the capacitor.

19. An electronic system comprising:
electrical components;
a health monitoring system for monitoring the health of the electronic system, the health monitoring system comprising:
a monitoring circuit including fatigue life characterized electrical components representative of at least a portion of the electrical components, wherein the fatigue life characterized electrical components are employed solely to monitor the health of the electronic system, the fatigue life characterized components including:
an oscillator;
a capacitor with a first side and a second side, wherein the first side is electrically connected to ground; and
a resistor with a first connection and a second connection opposite the first connection, wherein the first connection is electrically connected to the oscillator and the second connection is electrically connected to the second side of the capacitor; and
an analog-to-digital converter;
wherein an output of the monitoring circuit is electrically connected to the analog-to-digital converter; and
a power supply connection supplying power to the electrical components and to the health monitoring system.

20. The electronic system of claim 19, wherein the output of the monitoring circuit is between the second connection of the resistor and the second side of the capacitor.

* * * * *